United States Patent
Zhao et al.

(10) Patent No.: US 10,658,603 B2
(45) Date of Patent: May 19, 2020

(54) ELECTRODE AND AN ORGANIC ELECTROLUMINESCENT DEVICE USING THE SAME

(71) Applicants: Kunshan New Flat Panel Display Technology Center Co., Ltd., Yunshan Town Kunshan (CN); KunShan Go-Visionox Opto-Electronics Co., Ltd., Kunshan Development Zone (CN)

(72) Inventors: Fei Zhao, Yushan Town Kunshan (CN); Weiwei Li, Yushan Town Kunshan (CN); Chao Min, Yushan Town Kunshan (CN); Zhizhong Luo, Yushan Town Kunshan (CN)

(73) Assignee: Kunshan New Flat Panel Display Technology Center Co., Ltd., Yushan Town Kunshan, Jiangsu (CN)

( * ) Notice: Subject to any disclaimer, the term of this patent is extended or adjusted under 35 U.S.C. 154(b) by 0 days.

(21) Appl. No.: 16/314,736

(22) PCT Filed: Jan. 5, 2018

(86) PCT No.: PCT/CN2018/071553
§ 371 (c)(1),
(2) Date: Jan. 2, 2019

(87) PCT Pub. No.: WO2018/127127
PCT Pub. Date: Jul. 12, 2018

(65) Prior Publication Data
US 2019/0207139 A1   Jul. 4, 2019

(30) Foreign Application Priority Data
Jan. 5, 2017 (CN) .......................... 2017 1 0008675

(51) Int. Cl.
*H01L 51/52* (2006.01)
*H01L 51/50* (2006.01)

(52) U.S. Cl.
CPC ...... *H01L 51/5012* (2013.01); *H01L 51/5092* (2013.01); *H01L 51/52* (2013.01); *H01L 51/5221* (2013.01); *H01L 51/5056* (2013.01)

(58) Field of Classification Search
CPC combination set(s) only.
See application file for complete search history.

(56) References Cited

U.S. PATENT DOCUMENTS

| 6,255,774 B1 | 7/2001 | Pichler |
| 6,707,248 B1 | 3/2004 | Burroughes et al. |

(Continued)

FOREIGN PATENT DOCUMENTS

| CN | 1825662 A | 8/2006 |
| CN | 101339976 A | 1/2009 |

(Continued)

OTHER PUBLICATIONS

First Office Action of Chinese Patent Application No. 201710008675.4 with English translation.

(Continued)

*Primary Examiner* — Joseph L Williams
*Assistant Examiner* — Jacob R Stern
(74) *Attorney, Agent, or Firm* — McCarter & English, LLP

(57) ABSTRACT

An electrode and an organic electroluminescent device using the same are provided. The electrode includes a first layer (1) and a second layer (2) arranged in a stacked manner. The first layer (1) is an alkaline earth metal alloy layer and the second membrane (2) has a work function of 2.0 eV to 3.5 eV.

8 Claims, 1 Drawing Sheet

(56) References Cited

U.S. PATENT DOCUMENTS

| | | | |
|---|---|---|---|
| 6,765,350 B1 | 7/2004 | Burroughes et al. | |
| 6,992,438 B2 | 1/2006 | Burroughes et al. | |
| 7,071,612 B2 | 7/2006 | Burroughes et al. | |
| 7,429,822 B2* | 9/2008 | Morita | H01L 51/5221 313/504 |
| 2012/0168737 A1* | 7/2012 | Tomono | C09K 11/06 257/40 |
| 2014/0035457 A1 | 2/2014 | Yoon | |
| 2016/0133880 A1 | 5/2016 | Lee et al. | |

FOREIGN PATENT DOCUMENTS

| | | |
|---|---|---|
| CN | 103280535 A | 9/2013 |
| JP | 2003-068470 A | 3/2003 |
| JP | 2010062057 A | 3/2010 |
| TW | 201623572 A | 7/2016 |
| WO | 9810473 A1 | 3/1998 |
| WO | WO 98/10621 | 3/1998 |

OTHER PUBLICATIONS

Decision of Rejection of Taiwanese Application No. 107100556 with English translation.

PCT International Search Report for PCT/CN2018/071553 dated Apr. 8, 2018.

Taiwanese Office Action dated May 17, 2018 for Taiwanese Application No. 107210451330 (with English translation).

Pode, R.B. et al., "Transparent Conducting Metal Electrode for Top Emission Organic Light-Emitting Devices: Ca—Ag Double Layer", Applied Physics Letters, vol. 84, 4614, 2004.

Ban, D. et al., "Near-Infrared to Visible Light Optical Upconversion by Direct Tandem Integration of Organic Light-Emitting Diode and Inorganic Photodetector", Applied Physics Letters, vol. 90, 093108, 2007.

Chinese Second Office Action dated Aug. 13, 2019 for CN 2017100086754 with English translation.

English translation of Chinese Decision of Rejection dated Nov. 5, 2019 for Chinese Patent Application No. 201710008675.4.

English translation of Taiwanese Office Action after Reexamination Petition, dated Oct. 1, 2019, in Taiwanese Patent Application No. 107100556.

Extended European Search Report dated Nov. 8, 2019 for European Patent Application No. 18736549.9.

* cited by examiner

ELECTRODE AND AN ORGANIC ELECTROLUMINESCENT DEVICE USING THE SAME

CROSS-REFERENCE TO RELATED APPLICATIONS

This application is a 35 U.S.C. § 371 National Stage filing of International Application No. PCT/CN2018/071553, filed on Jan. 5, 2018, which claims priority to Chinese Patent Application No. 201710008675.4, filed Jan. 5, 2017.

TECHNICAL FIELD

The present invention pertains to the field of electroluminescence, and particularly relates to an electrode and an organic electroluminescent device using the same.

1. BACKGROUND

An Organic Light-Emitting Diode (OLED) is an active light-emitting device. As compared with Thin-Film-Transistor Liquid Crystal Display (LCD) and Plasma Display Panel (PDP) in the prior art of panel display technologies, organic light-emitting display devices using Organic Light-Emitting Diodes, as one of the technologies that have received the most attention in the panel display technology field, have advantages such as high contrast ratio, wide viewing angle, low power consumption and thinner volume, and are expected to become the next-generation mainstream panel display technology.

An OLED device mainly comprises an anode, an organic light-emitting layer and a cathode arranged in a stacked manner. In order to increase the electron injection efficiency, the OLED cathode is supposed to use a metal material having its work function that should be as low as possible, and because electrons are more difficult to be injected than holes, the level of work function of the metal seriously affects the light-emitting efficiency and service life of an OLED device, lower work function of the metal may achieve easier electron injection, so as to achieve higher light-emitting efficiency. Besides, lower work function may achieve lower barrier potential of the organics-metal interface, so as to achieve less Joule heat produced during work, thus, the service life of the device may be largely increased.

However, a single-layered metal cathode with a low work function, such as Mg, Ca, easily becomes oxidized in air, which causes instability of the device and shortens the service life, therefore, an alloy of metal with a low work function and anti-corrosion metal is usually selected to alleviate this problem. When cathode film made of a single metal is evaporation-plated, a lot of morphology defects or structural defects would be formed, which leads to deterioration of the oxidative resistance thereof. When an alloy cathode is evaporation-plated, a small amount of metal having relatively active chemical property would preferentially diffuse into the defects, which makes the film structure more complete, so as to make the entire cathode layer stable.

However, in actual use, the above-mentioned alloy cathode structure still has relatively poor stability. Research has proven that, the alkali metal forming the cathode's alloy would still reacts with water and oxygen in the air, which lowers the light-emitting efficiency of the device, and in the meantime the alkali metal would easily diffuse into the light-emitting layer and causes quenching of luminescence.

SUMMARY OF THE INVENTION

In view of the above, the present invention provides an electrode having stable performance and an organic electroluminescent device using the same.

The technical schemes adopted by the present invention are as follows:

The electrode of the present invention comprises a first layer and a second layer arranged in a stacked manner, the first layer is an alkali earth metal alloy layer, and the second layer has a work function of 2.0 eV to 3.5 eV.

Optionally, the second layer is a lanthanide metal layer and/or a lanthanide metal compound layer.

Optionally, a lanthanide metal element in the lanthanide metal layer and the lanthanide metal compound layer is Ytterbium and/or Europium.

Optionally, the mass percentage of alkali earth metal in the alkali earth metal alloy layer is 5%-50%.

Preferably, the mass percentage of alkali earth metal in the alkali earth metal alloy layer is 5%-20%.

Optionally, the alkali earth metal alloy layer further comprises silver and/or aluminum.

Optionally, the first layer has a thickness of 0.5 nm-30 nm.

Optionally, the second layer has a thickness of 0.5 nm-10 nm.

Preferably, the second layer has a thickness of 0.5 nm-2 nm.

The organic electroluminescent device of the present invention comprises a first electrode, an organic light-emitting layer and a second electrode arranged in a stacked manner, wherein, the second electrode is the above-mentioned electrode, and the second layer thereof is disposed adjacent to the organic light-emitting layer.

As compared to the prior art, the above-mentioned technical schemes of the present invention have the following advantages:

1. The electrode provided by embodiments of the present invention comprises a first layer and a second layer that are arranged in a stacked manner, the first layer is an alkali earth metal alloy layer, and the second layer has a work function of 2.0 eV to 3.5 eV. The applicant's research discovered that, such a composite layered electrode with a gradient of work function has very good stability, which can effectively prolong the service life of the device.

2. In the electrode provided by embodiments of the present invention, the work function of the second layer is only 2.0 eV to 3.5 eV, and when the second layer has a thickness of 0.5 nm-10 nm, it can effectively reduce the barrier potential of the organics-metal interface; in the meantime, the composite electrode structure with a gradient of work function can lower the electron injection barrier potential in a step-by-step manner, thereby providing orderly guidance for electron injection, so that the light-emitting efficiency of the device is improved.

3. In the electrode provided by embodiments of the present invention, the second layer is a lanthanide metal layer and/or a lanthanide metal compound layer. Lanthanide metal and lanthanide metal compound not only have relatively low work function, which can effectively lower the electron injection energy barrier and thus lower the drive voltage of the device, but also have relatively low light absorbance, which has relatively small impact on the light out-coupling efficiency. Also, lanthanide metal and lanthanide metal compound have stable chemical property during the evaporation-plating process, which is beneficial for mass production. The first layer is an alkali earth metal alloy layer, wherein the alkali earth metal can effectively prevent the substance in the second layer from dissolving in other cathode materials to form solid solution, which can effectively improve the stability of the electrode and thus improve the stability and service life of the device applying it.

BRIEF DESCRIPTION OF THE DRAWINGS

In order to make the content of the present invention easier to be understood clearly, hereinafter, the present invention is further described in detail according to specific embodiments of the present invention with reference to the accompanying drawings, wherein.

The reference signs in the accompanying drawings represent: 1-first layer, 2-second layer.

DETAILED DESCRIPTION OF EMBODIMENTS

In order to make the objective, technical scheme and advantages of the present invention clearer, detailed description of embodiments of the present invention is further given below, with reference to the accompanying drawings.

The present invention can be implemented in many different forms and should not be interpreted to be limited to the embodiments described herein. On the contrary, by providing these embodiments, the present disclosure is made complete and thorough, and the inventive concept of the present invention is sufficiently conveyed to those skilled in the art, wherein the present invention is only defined by the claims. In the accompanying drawings, for the sake of clarity, dimensions and relative sizes of layers and areas might be exaggerated.

Embodiment 1

Figure 1:
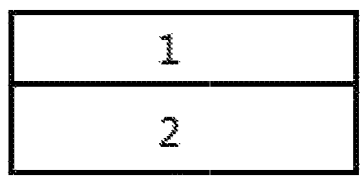
FIG. 1 is a structural schematic diagram of the electrode of Embodiment 1 of the present invention.

This embodiment provides an electrode, as shown in FIG. 1, the electrode comprises a first layer 1 and a second layer 2 arranged in a stacked manner, the first layer 1 is an alloy layer of Ag:Mg with a thickness of 13 nm. The mass percentage of Mg is 10%. The second layer is Yb layer with a thickness of 1 nm.

This embodiment also provides an organic electroluminescent device, Ag/ITO(20 nm)/HATCN(20 nm)/NPB (40 nm)/mCBP:10 wt % Ir(ppy)$_3$(30 nm)/TPBi(50 nm)/Yb(1 nm)/Ag:10% Mg(13 nm)/ITO(20 nm).

The first electrode is an Ag layer stacked with an ITO layer.

The hole injection layer is a HATCN (2,3,6,7,10,11-hexacyanyl-1,4,5,8,9,12-hexaazatriphenylene) layer.

The hole transport layer is a NPB (N,N'-di-(1-naphthyl)-N,N'-diphenyl-1,1'-biphenyl-4,4'-diamine) layer.

The light-emitting layer is a layer of CBP (4,4'-di-carbazolyl-biphenyl) doped with Ir(ppy)$_3$(tri-(2-phenylpyridinyl)-Iridium (III)).

The hole blocking layer is TPBi (1,3,5-tri-(1-phenyl-1H-benzimidazole-2-yl)-benzene) layer.

The second electrode is the above-mentioned electrode.

The optical coupling layer is ITO (Indium Tin Oxide) layer.

As alternative embodiments of the present invention, the structure of the organic electroluminescent device is not limited to this, as long as it applies the electrode of the present invention and can thereby realize the purpose of the present invention, these alternatives all belong to the protection scope of the present invention.

As alternative embodiments of the present invention, the material in the second layer is not limited to this, and any lanthanide metal and/or lanthanide metal compound having a work function of 2.0 eV to 3.5 eV applied therein can realize the purpose of the present invention and belongs to the protection scope of the present invention.

Embodiment 2

This embodiment provides an electrode with a structure similar to that of Embodiment 1, but the difference is that the first layer is Al layer, and the second layer has a thickness of 10 nm.

This embodiment also provides an organic electroluminescent device with a structure similar to that of Embodiment 1, but the difference is that the second electrode is an electrode according to this embodiment.

Embodiment 3

This embodiment provides an electrode with a structure similar to that of Embodiment 1, but the difference is that the second layer is Eu layer with a thickness of 0.5 nm.

This embodiment also provides an organic electroluminescent device with a structure similar to that of Embodiment 1, but the difference is that the second electrode is an electrode according to this embodiment.

Embodiment 4

This embodiment provides an electrode with a structure similar to that of Embodiment 1, but the difference is that the second layer is Yb$_2$O$_3$ layer, and the first layer has a Mg mass percentage of 5% and a thickness of 0.5 nm.

This embodiment also provides an organic electroluminescent device with a structure similar to that of Embodiment 1, but the difference is that the second electrode is an electrode according to this embodiment.

Embodiment 5

This embodiment provides an electrode with a structure similar to that of Embodiment 1, and the difference is: the second layer is a doped layer of YbN and Yb, wherein the mass ratio of YbN:Yb is 1:1; and the first layer is an alloy layer of Ag and Ca with a thickness of 30 nm, wherein the mass percentage of Ca is 20%.

This embodiment also provides an organic electroluminescent device with a structure similar to that of Embodiment 1, but the difference is that the second electrode is an electrode according to this embodiment.

Embodiment 6

This embodiment provides an electrode with a structure similar to that of Embodiment 1, and the difference is: the second layer is a doped layer of Yb and Ce$_2$O, wherein the mass ratio of Yb:Ce$_2$O is 1:1.

This embodiment also provides an organic electroluminescent device with a structure similar to that of Embodiment 1, but the difference is that the second electrode is an electrode according to this embodiment.

Embodiment 7

This embodiment provides an electrode with a structure similar to that of Embodiment 1, but the difference is that the first layer has a Mg mass percentage of 50%; and the second layer has a thickness of 2 nm.

This embodiment also provides an organic electroluminescent device with a structure similar to that of Embodiment 1, but the difference is that the second electrode is an electrode according to this embodiment.

Comparison Example 1

This comparison example provides an electrode which is an alloy layer of Ag and Mg with a thickness of 13 nm, wherein the mass ratio of Ag:Mg is 10:1.

This comparison example also provides an organic electroluminescent device with a structure similar to that of Embodiment 1, but the difference is that the second electrode is an electrode according to this comparison example.

Comparison Example 2

This comparison example provides an electrode with a structure similar to that of Embodiment 1, and the only difference is: the first layer has a Mg mass percentage of 70%.

This comparison example also provides an organic electroluminescent device with a structure similar to that of Embodiment 1, and the difference is: the second electrode is an electrode according to this comparison example.

Comparison Example 3

This comparison example provides an electrode with a structure similar to that of Embodiment 1, but the only difference is that the second layer has a thickness of 20 nm.

This comparison example also provides an organic electroluminescent device with a structure similar to that of Embodiment 1, but the difference is that the second electrode is an electrode according to this comparison example.

Test Example 1

When an organic electroluminescent device has worked for a long time, the organic films thereof may change from an initial amorphous film into a crystalline film, such a change of film would cause decaying of the device.

Therefore, the devices are annealed respectively at different temperatures for 1 hour, and the test results of $T_{97}$ (service time for the brightness of the device to decay from 10000 nit to 97% thereof) of the annealed devices as compared to unannealed devices (25° C.) are listed in Table 1.

TABLE 1

Test results of $T_{97}$ of devices annealed respectively at different temperatures for 1 hour

| | annealing temperature | | | | |
| --- | --- | --- | --- | --- | --- |
| | unannealed $T_{97}$ (h) | 80° C. $T_{97}$ (h) | 100° C. $T_{97}$ (h) | 120° C. $T_{97}$ (h) | 140° C. $T_{97}$ (h) |
| Embodiment 1 | 573 | 553 | 532 | 420 | 375 |
| Embodiment 2 | 521 | 506 | 418 | 321 | 280 |
| Embodiment 3 | 550 | 532 | 453 | 398 | 312 |
| Embodiment 4 | 567 | 507 | 487 | 425 | 301 |
| Embodiment 5 | 503 | 499 | 466 | 304 | 241 |
| Embodiment 6 | 515 | 478 | 432 | 263 | 199 |
| Embodiment 7 | 570 | 543 | 512 | 401 | 305 |
| Comparison example 1 | 496 | 425 | 382 | 257 | 109 |

TABLE 1-continued

Test results of $T_{97}$ of devices annealed respectively at different temperatures for 1 hour

| | annealing temperature | | | | |
| --- | --- | --- | --- | --- | --- |
| | unannealed $T_{97}$ (h) | 80° C. $T_{97}$ (h) | 100° C. $T_{97}$ (h) | 120° C. $T_{97}$ (h) | 140° C. $T_{97}$ (h) |
| Comparison example 2 | 501 | 415 | 382 | 217 | 91 |
| Comparison example 3 | 454 | 325 | 252 | 147 | 79 |

The data in Table 1 indicates that, when the electrode of the present invention is used in a device, the device's service life is far longer than the service life of the devices provided by the Comparison examples, and in high temperature environment (140° C.) it can even be longer than 4 times of the service life of Comparison example 1. Therefore, the electrode of the present invention has excellent high-temperature stability.

Figure 2:
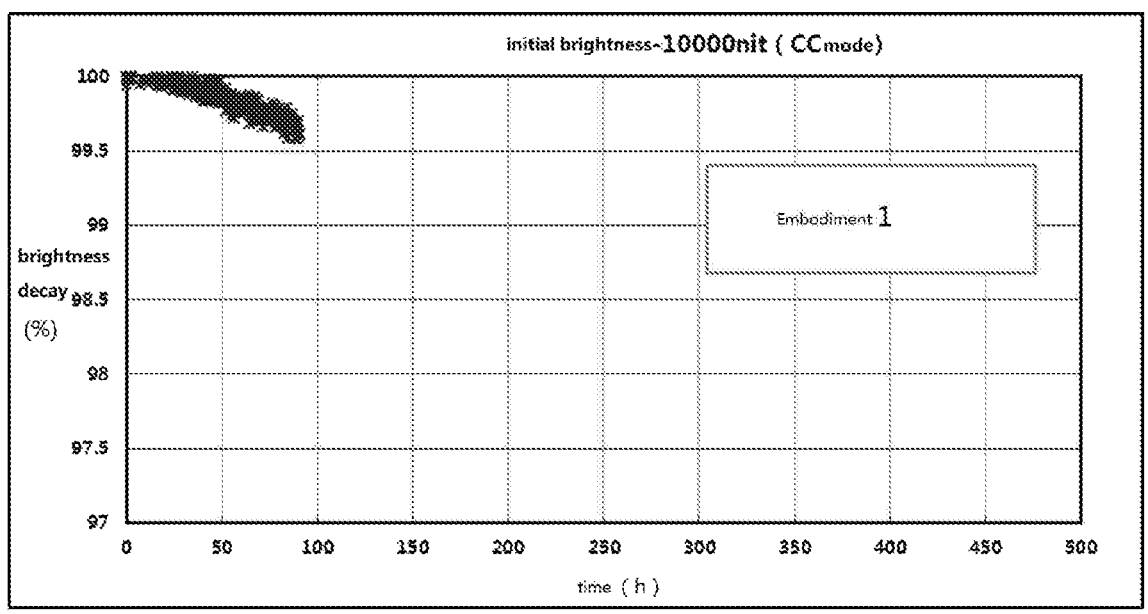
FIG. 2 is a stability test diagram of the organic electroluminescent device of Embodiment 1 of the present invention.

The stability test diagram of the organic electroluminescent device of Embodiment 1 is shown in FIG. 2. When testing the OLED device, it is a common way to use high current density testing which utilized a circuit compensation principle. For an ultra-high brightness of 10000 nit, the organic electroluminescent device of Embodiment 1 keeps its brightness above 99.5% thereof during 100 hours of working, which indicates this device has high stability, so it is proved that the cathode metal used by the present invention can form a dense metal film to effectively resist corrosion caused by water and oxygen, thereby preventing the cathode metal layer from being oxidized and thus improving the stability of the device.

Test Example 2

Dynamic service-life experiments (50% alternating checkerboard evaluation) are carried out in a certain work environment, wherein the display screen is lit up in a pattern of alternating checkerboard which changes once every 10 seconds; the service life of the device is evaluated by measuring the brightness decay, and the experiment is stopped when the brightness decays to 50% of the initial brightness, wherein the brightness is measured by using a Spectrascan PR655 photometer. The dynamic service life values of the devices of the Embodiments and Comparison examples measured at normal temperature (25° C.) are listed in Table 2.

TABLE 2

Results of dynamic service-life experiments of devices at normal temperature (25° C.)

| Groups | Required brightness (cd/m$^2$) | Drive voltage (V) | Current efficiency (cd/A) | Service life (h) |
| --- | --- | --- | --- | --- |
| Embodiment 1 | 10000 | 4.34 | 110 | 573 |
| Embodiment 2 | 10000 | 5.72 | 90 | 521 |
| Embodiment 3 | 10000 | 4.89 | 101 | 550 |
| Embodiment 4 | 10000 | 4.68 | 105 | 567 |
| Embodiment 5 | 10000 | 5.46 | 99 | 503 |
| Embodiment 6 | 10000 | 5.84 | 91 | 515 |
| Embodiment 7 | 10000 | 5.73 | 97 | 570 |
| Comparison example 1 | 10000 | 5.90 | 83 | 496 |
| Comparison example 2 | 10000 | 5.82 | 96 | 501 |

TABLE 2-continued

Results of dynamic service-life experiments of devices at normal temperature (25° C.)

| Groups | Required brightness (cd/m$^2$) | Drive voltage (V) | Current efficiency (cd/A) | Service life (h) |
|---|---|---|---|---|
| Comparison example 3 | 10000 | 4.31 | 102 | 454 |

It can be seen from the test results in Table 2 that, the electrode provided by the present invention has excellent electron injection capability and stability, and the organic electroluminescent devices produced thereby have a relatively low drive voltage, a relatively high current efficiency and a relatively long service life.

Apparently, the aforementioned embodiments are merely examples illustrated for clearly describing the present invention, rather than limiting the implementation ways thereof. For a person skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present invention.

The invention claimed is:

1. An electrode, comprising a first layer and a second layer arranged in a stacked manner, the first layer is an alkali earth metal alloy layer, and the second layer has a work function of 2.0 eV to 3.5 eV, wherein the second layer is a $Yb_2O_3$ layer, a doped layer of YbN and Yb, or a doped layer of Yb and $Ce_2O$.

2. The electrode according to claim 1, wherein the second layer is a lanthanide metal layer and/or a lanthanide metal compound layer.

3. The electrode according to claim 1, the first layer is an alloy layer of alkali earth metal and silver, and the mass percentage of alkali earth metal in the first layer is 5%-50%.

4. The electrode according to claim 3, wherein the mass percentage of alkali earth metal in the first layer is 5%-20%.

5. The electrode according to claim 1, wherein the first layer has a thickness of 0.5 nm-30 nm.

6. The electrode according to claim 1, wherein the second layer has a thickness of 0.5 nm-10 nm.

7. The electrode according to claim 6, wherein the second layer has a thickness of 0.5 nm-2 nm.

8. An organic electroluminescent device, comprising a first electrode, an organic light-emitting layer and a second electrode arranged in a stacked manner, wherein, the second electrode comprises a first layer and a second layer arranged in a stacked manner, the first layer is an alkali earth metal alloy layer, the second layer has a work function of 2.0 eV to 3.5 eV, wherein the second layer is a $Yb_2O_3$ layer, a doped layer of YbN and Yb, or a doped layer of Yb and $Ce_2O$, and the second layer is disposed adjacent to the organic light-emitting layer.

* * * * *